United States Patent
Henrie

(10) Patent No.: US 8,531,343 B1
(45) Date of Patent: Sep. 10, 2013

(54) ELECTROMAGNETIC ENVIRONMENT SIMULATION METHOD

(75) Inventor: Justin Henrie, Camarillo, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 495 days.

(21) Appl. No.: 12/770,372

(22) Filed: Apr. 29, 2010

(51) Int. Cl.
  *G01R 29/10* (2006.01)
(52) U.S. Cl.
  USPC .................. 343/703; 343/757; 455/67.11
(58) Field of Classification Search
  USPC .............. 343/703, 757; 455/67.11
  See application file for complete search history.

(56) References Cited

U.S. PATENT DOCUMENTS

| | | | |
|---|---|---|---|
| 6,249,248 B1 | 6/2001 | Kitayoshi |
| 6,285,330 B1 | 9/2001 | Perl |
| 7,994,991 B2 | 8/2011 | Grange |
| 8,325,098 B1 | 12/2012 | Henrie |
| 2008/0094295 A1 | 4/2008 | Hess |

OTHER PUBLICATIONS

Levitas, Ultrawideband and ultrashort Impulse Signal, Sep. 18-22, 2006, Sevastopol, Ukraine, pp. 90-95.*

* cited by examiner

*Primary Examiner* — Dieu H Duong
(74) *Attorney, Agent, or Firm* — Christopher L. Blackburn

(57) ABSTRACT

An electromagnetic environment simulation method. Embodiments of the invention provide for nanosecond or better time resolution and milliradian angular resolution simulation of the dynamic electromagnetic environment of a wireless system under test.

2 Claims, 5 Drawing Sheets

ELECTROMAGNETIC ENVIRONMENT SIMULATION METHOD

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates: to testing methods for wireless sensing and communications systems.

It is to be understood that the foregoing and the following detailed description are exemplary and explanatory only and are not to be viewed as being restrictive of the invention, as claimed. Advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

Figure 1A:
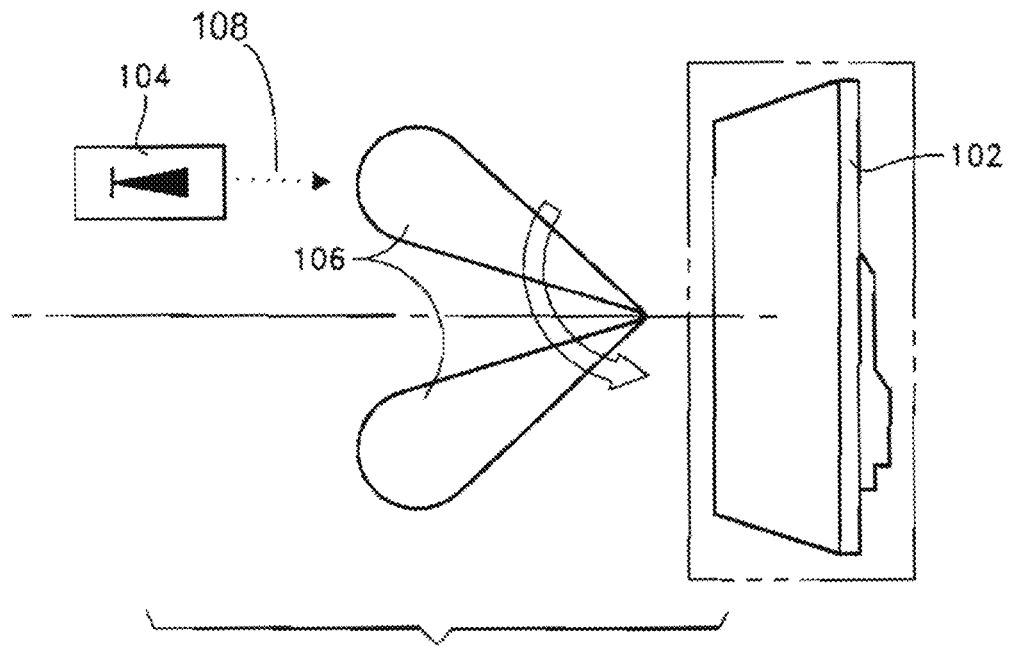
FIG. 1A depicts a probe antenna in an orientation in relation to an embodiment of a wireless system under test in accordance with principles of the invention.
Figure 1B:
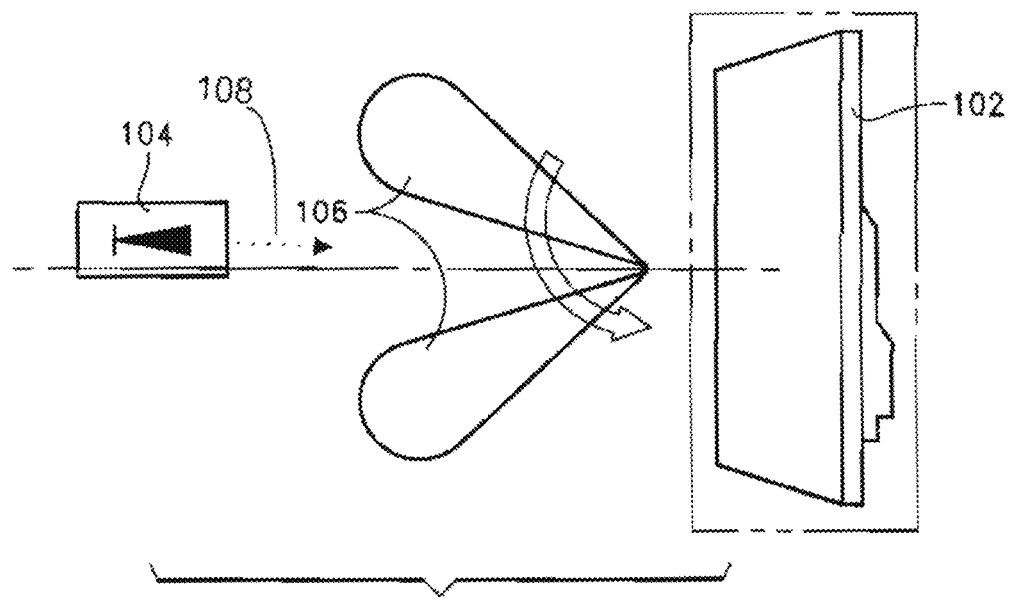
FIG. 1B depicts a probe antenna in an orientation in relation to an embodiment of a wireless system under test in accordance with principles of the invention.
Figure 1C:
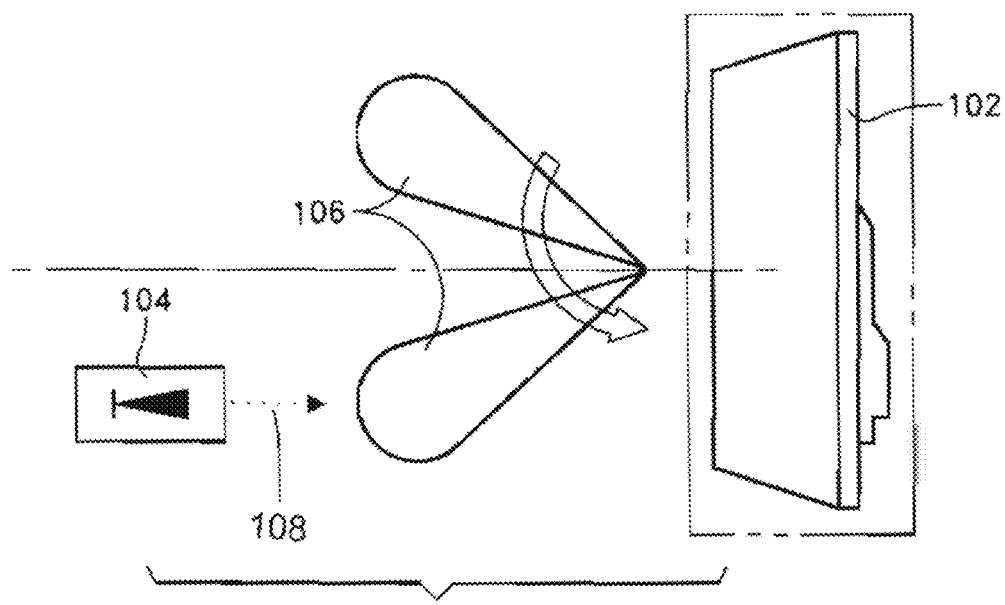
FIG. 1C depicts a probe antenna in an orientation in relation to an embodiment of a wireless system under test in accordance with principles of the invention.

Embodiments of the invention generally relate to testing methods for a wireless system. A wireless system is any electronic system which receives or transmits electromagnetic radiation, including, for example, a radar system or communications basestation. The wireless system under test could be a complete wireless system, or any radiating or receiving subcomponent of a wireless system, including an antenna. FIGS. 1A-C illustrate an embodiment of a wireless system under test as an antenna 102.

In this procedure, the measurement (probe) antenna 104 transmits a signal 108 at each position, relative to the wireless system under test 102, it occupies (in some embodiments, the probe antenna 104 and wireless system under test 102 do not change orientation with respect to each other), and a wireless system under test 102 receives them. In this way the measurement facility can be used to simulate any type of electromagnetic environment (e.g. radar return pulse from multiple targets, with appropriate Radar Cross Section "RCS" and Doppler effects). In some embodiments, the waveforms received through the wireless system under test 102 are correlated and combined to recover the information in a single wide-angle return pulse.

Embodiments of the invention provide for nanosecond or better time resolution and milliradian or better angular resolution of a simulated electromagnetic environment over a predetermined solid angle area (up to $4\pi$ steradians). The electromagnetic environment is all of the electromagnetic radiation impinging on a wireless device, at any frequency and from any direction. The method enables the simulation of the electromagnetic environment of a wireless system under test 102 within an anechoic chamber or other testing facility.

The method is implemented in an antenna measurement facility. The antenna measurement facility can be any facility that has a probe antenna 104 and a signal 108 source such as, for example, a vector signal generator. The probe antenna 104 is any antenna whose radiation pattern characteristics are known and are suitable to antenna measurement testing. In embodiments in which the position of the wireless system under test 102 and the probe antenna 104 is varied, the probe antenna 104 transmits a signal 108 from multiple different positions relative to the wireless system under test 102. The wireless system under test 102 receives and records these signals sequentially. Then all the separately received signals are superposed to yield the total receive signal that the wireless system under test 102 would have received if all the signals transmitted from the probe antenna 104 had arrived at the wireless system under test 102 simultaneously. In this way the measurement facility can be used to simulate any type of electromagnetic environment (e.g. a radar return pulse from multiple targets, with appropriate scattering, fading, and Doppler effects) that might be experienced by the wireless system under test 102.

Section I below describes an embodiment of a method performed in accordance with the principles of embodiments of the invention in which the orientation of the wireless system under test 102 does not change with respect to the probe antenna 104 (referred to as "Single-Angle"). Section I is broken up into sub-sections A and B. Sub-Section I(A) describes one embodiment of a Single-Angle method performed in accordance with the principles of embodiments of the invention in which the wireless system under test 102 is not an electronically steerable antenna. Sub-Section I(S) describes one embodiment of a Single-Angle method performed in accordance with the principles of embodiments of the invention in which the wireless system under test 102 is an electronically steerable antenna.

Section II below describes an embodiment of a method performed in accordance with the principles of embodiments of the invention in which the orientation of the wireless system under test 102 changes with respect to the probe antenna 104 (referred to as "Multiple-Angle"). Section II is broken up into sub-sections A and B. Sub-Section II(A) describes an embodiment of a Multiple-Angle method performed in accordance with the principles of embodiments of the invention in which the wireless system under test 102 is not an electronically steerable antenna. Sub-Section II(B) describes an embodiment of a Multiple-Angle method performed in accordance with the principles of embodiments of the invention in which the wireless system under test 102 is an electronically steerable antenna.

Figure 2:
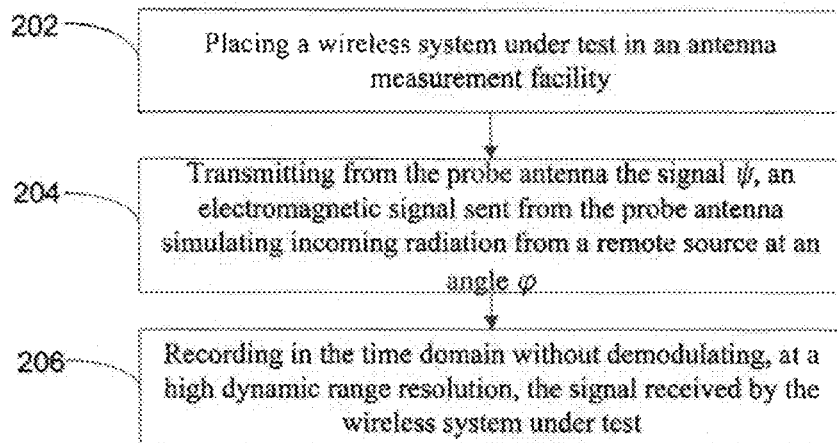
FIG. 2 illustrates a flowchart describing an embodiment of a method performed in accordance with the principles of the invention.
Figure 3:
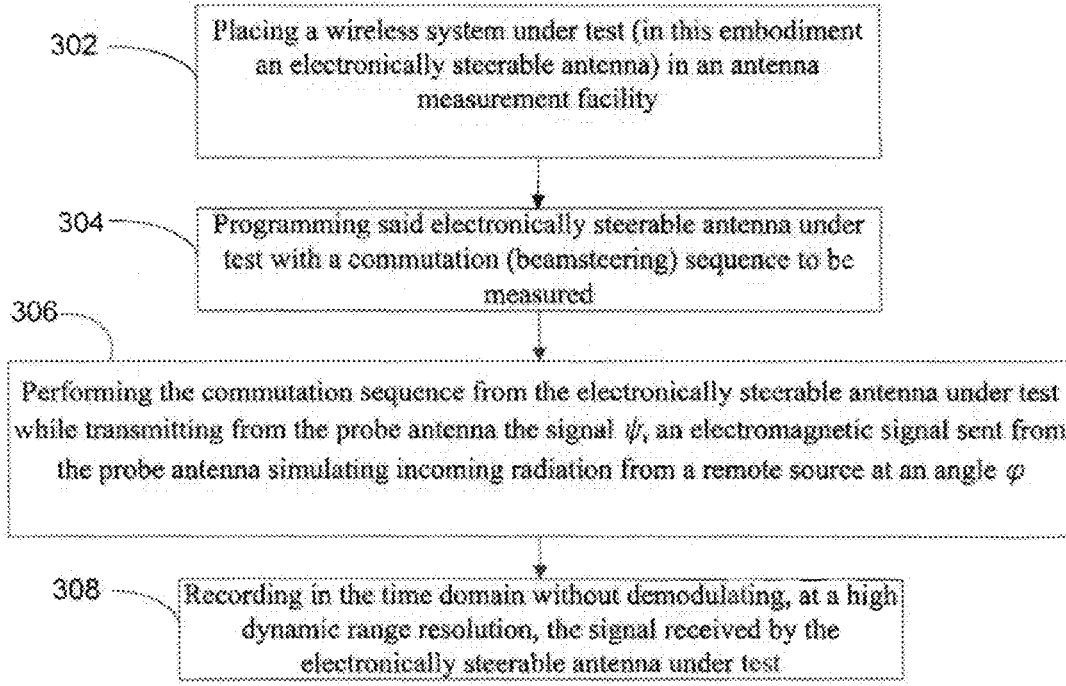
FIG. 3 illustrates a flowchart describing an embodiment of a method performed in accordance with the principles of the invention.

I. Single-Angle Case (FIGS. 2 and 3)

As a signal is received by the wireless system under test 102 (FIGS. 1A-C), it will undergo a certain amount of distortion due to the effects of the components of the wireless system under test 102 including the gain of the antenna and other system parameters. In this Section I of the Detailed Description, the waveform received by the wireless system under test 102 due to excitation $\psi$ is referred to as $\chi$.

A. Non-Electronically Steerable Antenna (FIG. 2)

An embodiment of a single-angle-case-non-electronically-steerable-antenna electromagnetic environment simulation method performed in accordance with the principles of the invention includes: placing a wireless system under test in an antenna measurement facility, the antenna measurement facility having a probe antenna; transmitting from the probe antenna a signal $\psi$, an electromagnetic signal sent from the probe antenna simulating incoming radiation from a remote source at angle $\phi$; and, recording in the time domain without demodulating, at a high dynamic range resolution, the signal received by the wireless system under test.

The wireless system under test 102 (FIGS. 1A-C) is placed in an antenna measurement facility (step 202 in FIG. 2).

The probe antenna 104 (FIGS. 1A-C) transmits the signal $\psi$, an electromagnetic signal sent from the probe antenna 104 simulating incoming radiation from a remote source at angle $\phi$ (step 204 in FIG. 2).

The signal $\chi$ is received by the wireless system under test 102 and recorded in the time domain without demodulating, at a high dynamic range resolution (step 206 in FIG. 2).

B. Electronically Steerable Antenna (FIG. 3)

An embodiment of a single-angle-case-electronically-steerable-antenna electromagnetic environment simulation method performed in accordance with the principles of the invention includes: placing a electronically steerable antenna under test in an antenna measurement facility, the antenna measurement facility having a probe antenna; programming the electronically steerable antenna under test with a receive-mode commutation (beamsteering) sequence to be measured; performing the receive-mode commutation sequence from the electronically steerable antenna under test; transmitting from the probe antenna a signal $\psi$, an electromagnetic signal sent from the probe antenna simulating incoming radiation from a remote source at angle $\phi$; and recording in the time domain without demodulating, at a high dynamic range resolution, the signal received by the electronically steerable antenna under test.

The wireless system under test 102 (FIGS. 1A-C) (in this case an electronically steerable antenna) is placed in an antenna measurement facility (step 302 in FIG. 3).

The electronically steerable antenna under test 102 (FIGS. 1A-C) is programmed with the receive-mode commutation (beamsteering) sequence to be measured (step 304 in FIG. 3).

The electronically steerable antenna under test 102 (FIGS. 1A-C) performs the receive-mode commutation sequence while the probe antenna transmits the signal $\psi$, an electromagnetic signal sent from the probe antenna 104 simulating incoming radiation from a remote source at angle $\phi$ (step 306 in FIG. 3).

The signal $\chi$ is received by the wireless system under test 102 and recorded in the time domain without demodulating (or alternatively the magnitude and phase data as a function of time can be recorded in such a way that the complete original signal can be reconstructed), at a high dynamic range resolution (step 308 in FIG. 3).

Figure 4:
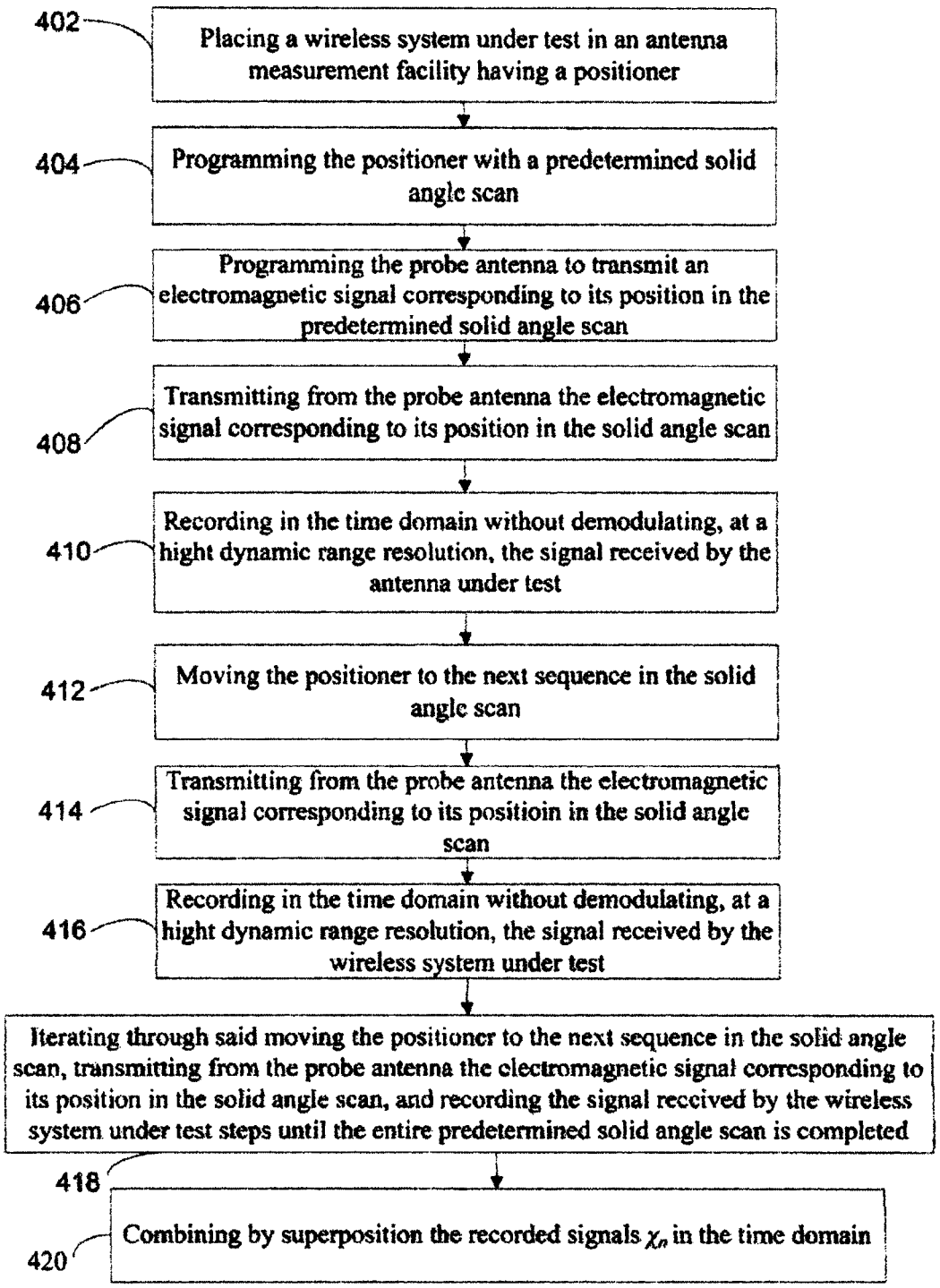
FIG. 4 illustrates a flowchart describing an embodiment of a method performed in accordance with the principles of the invention.
Figure 5:
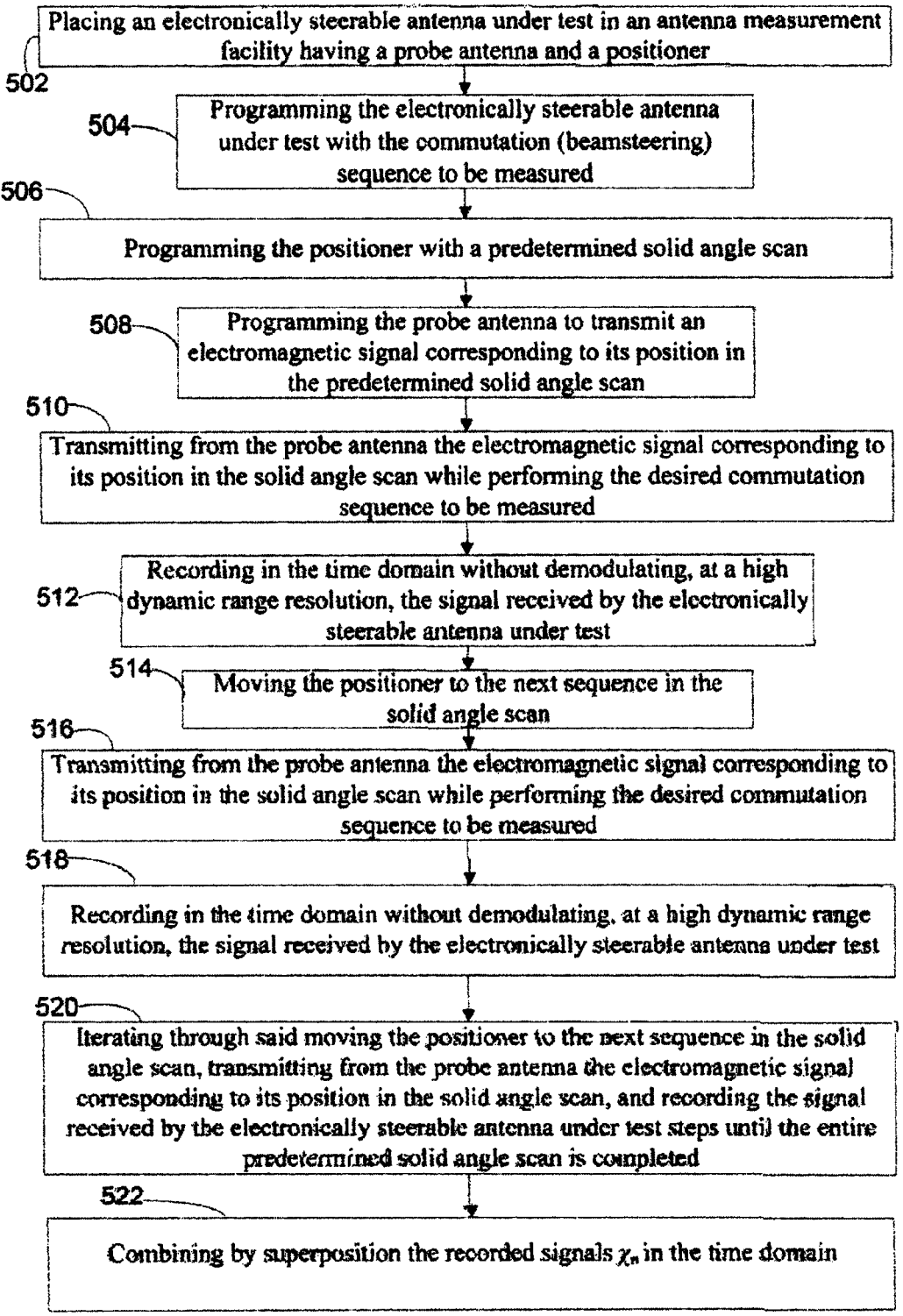
FIG. 5 provides a flowchart describing an embodiment of a method performed in accordance with the principles of the invention.

II. Multiple-Angle Case (FIGS. 4 and 5)

The embodiments described in this Section II of this Detailed Description are capable of simulating incoming electromagnetic signals from multiple independent sources at multiple incoming angles relative to the wireless system under test 102 (FIGS. 1A-C). In this Section II of this Detailed Description, we will refer to an independent incoming electromagnetic signal transmitted from the probe antenna at an orientation relative to the wireless system under test that simulates the electromagnetic signals impinging on the wireless system under test in an arbitrary environment, as $\psi_n$, where n=1 . . . N (where N=the total number of relative orientations). We will refer to the angle at which the signals $\psi_n$ impinge on the wireless system under test 102 as $\phi_n$ (where $\phi_n$ corresponds to $\psi_n$) denoting different signal sources and incoming angles. As a signal is received by the wireless system under test 102, it will undergo a certain amount of distortion due to the effects of the components of the wireless system under test 102 such as the gain of the antenna at angle $\phi_n$ and other system parameters. We will refer to the waveform received by the wireless system under test 102 due to the transmitted excitation $\psi_n$ as $\chi_n$ (where $\chi_n$ corresponds to $\psi_n$).

A. Non-Electronically Steerable Antenna (FIG. 4)

An embodiment of a multiple-angle-case-non-electronically-steerable-antenna electromagnetic environment simulation method performed in accordance with the principles of the invention includes: placing a wireless system under test in an antenna measurement facility having a probe antenna and a positioner; programming the positioner with a predetermined solid angle scan; programming the probe antenna to transmit an electromagnetic signal $\psi_n$ corresponding to its position relative to the wireless system under test in the predetermined solid angle scan $\phi_n$; transmitting from the probe antenna an initial electromagnetic signal $\psi_1$ corresponding to its position relative to the wireless system under test in the solid angle scan $\phi_1$; recording in the time domain without demodulating, at a high dynamic range resolution, the signal $\chi_1$ received by the wireless system under test; moving the positioner to the next sequence in the solid angle scan; transmitting from the probe antenna a non-initial electromagnetic signal $\psi_n$ corresponding to its position relative to the wireless system under test $\phi_n$ in the solid angle scan; recording in the time domain without demodulating, at a high dynamic range resolution, the signal $\chi_n$ received by the wireless system under test; iterating through the moving the positioner to the next sequence in the solid angle scan, transmitting from the probe antenna the non-initial electromagnetic signal $\psi_n$ corresponding to its position relative to the wireless system under test $\phi_n$ in the solid angle scan, and recording the signal $\chi_n$ received by the wireless system under test steps until the entire predetermined solid angle scan is completed; and combining by superposition in the time domain the signals $\chi_n$.

The wireless system under test 102 is placed in an antenna measurement facility that has a positioner (step 402 in FIG. 4). The antenna positioning hardware is used to position the wireless system under test 102 and the probe antenna 104 so that the relative angle between them may be set arbitrarily. The positioner orients the probe antenna 102 at the angle $\phi_1$ with respect to the wireless system under test 104 from which simulated electromagnetic radiation is impinging on the wireless system under test 104.

The antenna measurement facility's antenna positioner is programmed with a predetermined solid angle scan (step 404 in FIG. 4).

The probe antenna 104 (FIGS. 1A-C) is programmed to transmit an electromagnetic signal, $\psi_n$, corresponding to its position in the predetermined solid angle scan, i.e., at the angle $\phi_n$ (step 406 in FIG. 4).

With the probe antenna 104 (FIG. 1A) at its initial position relative to the wireless system under test 102, $\phi_1$, the probe antenna 104 transmits the corresponding signal $\psi_1$, simulating incoming radiation from a remote source at angle $\phi_1$ (step 408 in FIG. 4).

The signal $\chi_1$ is received by the wireless system under test 102 (FIG. 1A) and recorded in the time domain without demodulating (or alternatively the magnitude and phase data as a function of time can be recorded in such a way that the complete original signal can be reconstructed), at a high dynamic range resolution so that the signal can be meaningfully combined with signals received in the following steps of the method (step 410 in FIG. 4).

The positioner is moved to a new angle $\phi_n$ relative to the wireless system under test 102 (FIG. 1B), (step 412 in FIG. 4).

The probe antenna 104 (FIG. 1B) emits the signal $\psi_n$ which is characteristic of the radiation source being simulated at $\phi_n$ (step 414 in FIG. 4).

The signal $\chi_n$ is received by the wireless system under test 102 (FIG. 1B) and recorded in the time domain without demodulating (or alternatively the magnitude and phase data as a function of time can be recorded in such a way that the complete original signal can be reconstructed), at a high dynamic range resolution so that the signal can be meaningfully combined with signals received in the following steps of the method (step 416 in FIG. 4).

The steps outlined in paragraphs 34-36 are repeated, thus stepping through the solid angle scan, until the radiation from all desired sources has been emitted by the probe antenna 102 (FIGS. 1A-C) at the appropriate angle $\phi_n$ and received by the wireless system under test 104 (step 418 in FIG. 4).

After all desired signal sources have been received by the wireless system under test 102 (FIGS. 1A-C) and recorded as $\chi_n$, these recorded signals are combined by superposition in the time domain (step 420 in FIG. 4). The sum of these signals is the aggregate signal that would be received by the wireless system under test 102 if all the signals output by the probe antenna 104 had been received simultaneously, as in the actual fielded operation of the wireless system under test 102.

B. Electronically Steerable Antenna (FIG. 5)

An embodiment of a multiple-angle-case-electronically-steerable-antenna electromagnetic environment simulation method performed in accordance with the principles of the invention includes: placing an electronically steerable antenna under test in an antenna measurement facility having a probe antenna and a positioner; programming the electronically steerable antenna under test with the receive-mode commutation (beamsteering) sequence to be measured; programming the positioner with a predetermined solid angle scan; programming the probe antenna to transmit an electromagnetic signal $\psi_n$ corresponding to its position relative to the electronically steerable antenna under test in the predetermined solid angle scan $\phi_n$; transmitting from the probe antenna an initial electromagnetic signal $\psi_1$ corresponding to its position relative to the electronically steerable antenna under test $\phi_1$ in the predetermined solid angle scan while performing the desired receive-mode commutation sequence to be measured; recording in the time domain without demodulating, at a high dynamic range resolution, the signal $\chi_1$ received by the electronically steerable antenna under test; moving the positioner to the next sequence in the solid angle scan; transmitting from the probe antenna a non-initial electromagnetic signal $\psi_n$ corresponding to its position relative to the electronically steerable antenna under test $\phi_n$ in the solid angle scan while performing the desired receive-mode commutation sequence to be measured; recording in the time domain without demodulating, at a high dynamic range resolution, the signal $\chi_n$ received by the electronically steerable antenna under test; iterating through the moving the positioner to the next sequence in the solid angle scan, transmitting from the probe antenna the non-initial electromagnetic signal $\psi_n$ corresponding to its position relative to the wireless system under test $\phi_n$ in the solid angle scan, and recording the signal $\chi_n$ received by the electronically steerable antenna under test steps until the entire predetermined solid angle scan is completed; and combining by superposition in the time domain the signals $\chi_n$.

The wireless system under test 102 is placed in an antenna measurement facility that has a positioner (step 502 in FIG. 5). The antenna positioning hardware is used to position the wireless system under test 102 and the probe antenna 104 so that the relative angle between them may be set arbitrarily. The positioner orients the probe antenna 102 at the angle $\phi_1$ with respect to the wireless system under test 104 from which simulated electromagnetic radiation is impinging on the wireless system under test 104.

The electronically steerable antenna under test 102 (FIGS. 1A-C) is programmed with the receive-mode commutation (beamsteering) sequence to be measured (step 504 in FIG. 5).

The antenna measurement facility's antenna positioner is programmed with a predetermined solid angle scan (step 506 in FIG. 5).

The probe antenna 104 (FIGS. 1A-C) is programmed to transmit an electromagnetic signal, $\psi_n$, corresponding to its position in the predetermined solid angle scan, i.e., at the angle $\phi_n$ (step 508 in FIG. 5).

With the probe antenna 104 (FIG. 1A) at its initial position relative to the wireless system under test 102, ($\phi_1$, the probe antenna 104 transmits the corresponding signal $\psi_1$, (simulating incoming radiation from a remote source at angle $\phi_1$) while the electronically steerable antenna under test 104 performs the receive-mode commutation sequence (step 10 in FIG. 5).

The signal $\chi_1$ is received by the wireless system under test 102 (FIG. 1A) and recorded in the time domain without demodulating (or alternatively the magnitude and phase data as a function of time can be recorded in such a way that the complete original signal can be reconstructed), at a high dynamic range resolution so that the signal can be meaningfully combined with signals received in the following steps of the method (step 512 in FIG. 5).

The positioner is moved to a new angle $\phi_n$ (where n=2 . . . N) relative to the wireless system under test 102 (FIG. 1B), (step 514 in FIG. 5).

The probe antenna 104 (FIG. 1B) transmits the signal $\psi_n$ which is characteristic of the radiation source being simulated at $\phi_n$, while the electronically steerable antenna under test 102 performs the receive-mode commutation sequence (step 516 in FIG. 5).

The signal $\chi_n$ is received by the wireless system under test 102 (FIG. 1B) and recorded in the time domain without demodulating (or alternatively the magnitude and phase data as a function of time can be recorded in such away that the complete original signal can be reconstructed), at a high dynamic range resolution so that the signal can be meaningfully combined with signals received in the following steps of the method (step 518 in FIG. 5).

The steps outlined in paragraphs 46-48 are repeated, thus stepping through the solid angle scan, until the radiation from all desired sources has been emitted by the probe antenna 104 (FIGS. 1A-C) at the appropriate angle $\phi_n$ and received by the wireless system under test (step 520 in FIG. 5).

After all desired signal sources have been received by the wireless system under test 102 (FIGS. 1A-C) and recorded as $\chi_n$, these recorded signals can be combined by superposition in the time domain (step 522 in FIG. 5). The sum of these signals is the aggregate signal that would be received by the wireless system under test 102 if all the signals output by the probe antenna 104 had been received simultaneously, as in the actual fielded operation of the wireless system under test 102.

In addition, to simulation of an electromagnetic environment, the technique has other possible applications. The probe antenna 104 angles $\phi_n$ could be as tightly spaced as necessary in order to provide a good spatial sampling resolution in order to characterize an electronically steerable antenna's dynamic receive pattern. The transmitted signals $\psi_n$ would likely all be identical, perhaps a pure tone from which the time-dependent amplitude and phase shift imposed by the electronically steerable antenna under test 102 at angle $\phi_n$ could easily be derived by a comparison of $\psi_n$ and $\chi_n$.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. An electromagnetic environment simulation method comprising:

placing a wireless system under test in an antenna measurement facility having a probe antenna and a positioner;

programming said positioner with a predetermined solid angle scan;

programming said probe antenna to transmit an electromagnetic signal $\psi_n$ corresponding to its position relative to the wireless system under test in the predetermined solid angle scan $\phi_n$;

transmitting from said probe antenna an initial electromagnetic signal $\psi_1$ corresponding to its position relative to the wireless system under test in the solid angle scan $\phi_1$;

recording in the time domain without demodulating, at a high dynamic range resolution, the signal $\chi_1$ received by said wireless system under test;

moving said positioner to the next sequence in the solid angle scan;

transmitting from said probe antenna a non-initial electromagnetic signal $\psi_n$ corresponding to its position relative to the wireless system under test $\phi_n$ in the solid angle scan;

recording in the time domain without demodulating, at a high dynamic range resolution, the signal $\chi_n$ received by said wireless system under test;

iterating through said moving said positioner to the next sequence in the solid angle scan, transmitting from said probe antenna said non-initial electromagnetic signal $\psi_n$ corresponding to its position relative to the wireless system under test $\phi_n$ in the solid angle scan, and recording the signal $\chi_n$ received by said wireless system under test steps until the entire predetermined solid angle scan is completed; and combining by superposition in the time domain the signals $\chi_n$.

2. An electromagnetic environment simulation method comprising:

placing an electronically steerable antenna under test in an antenna measurement facility having a probe antenna and a positioner;

programming said electronically steerable antenna under test with the receive-mode commutation (beamsteering) sequence to be measured;

programming said positioner with a predetermined solid angle scan;

programming said probe antenna to transmit an electromagnetic signal $\psi_n$ corresponding to its position relative to said electronically steerable antenna under test in the predetermined solid angle scan $\phi_n$;

transmitting from said probe antenna an initial electromagnetic signal $\psi_1$ corresponding to its position relative to said electronically steerable antenna under test $\phi_1$ in the predetermined solid angle scan while performing the desired receive-mode commutation sequence to be measured;

recording in the time domain without demodulating, at a high dynamic range resolution, the signal $\chi_1$ received by said electronically steerable antenna under test;

moving said positioner to the next sequence in the solid angle scan;

transmitting from said probe antenna a non-initial electromagnetic signal $\psi_n$ corresponding to its position relative to the electronically steerable antenna under test $\phi_n$ in the solid angle scan while performing the desired receive-mode commutation sequence to be measured;

recording in the time domain without demodulating, at a high dynamic range resolution, the signal $\chi_n$ received by said electronically steerable antenna under test;

iterating through said moving the positioner to the next sequence in the solid angle scan, transmitting from said probe antenna said non-initial electromagnetic signal $\psi_n$ corresponding to its position relative to the wireless system under test $\phi_n$ in the solid angle scan, and recording the signal $\chi_n$ received by said electronically steerable antenna under test steps until the entire predetermined solid angle scan is completed; and combining by superposition in the time domain the signals $\chi_n$.

* * * * *